United States Patent
Sekimoto

(10) Patent No.: US 8,419,884 B2
(45) Date of Patent: Apr. 16, 2013

(54) METHOD FOR MANUFACTURING MULTILAYER WIRING SUBSTRATE

(75) Inventor: Yasuyuki Sekimoto, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 310 days.

(21) Appl. No.: 12/813,600

(22) Filed: Jun. 11, 2010

(65) Prior Publication Data
US 2010/0236698 A1    Sep. 23, 2010

Related U.S. Application Data

(63) Continuation of application No. PCT/JP2008/073173, filed on Dec. 19, 2008.

(30) Foreign Application Priority Data

Dec. 25, 2007   (JP) ................. 2007-331339

(51) Int. Cl.
    *H05K 3/46*    (2006.01)
(52) U.S. Cl.
    USPC ......... 156/272.2; 156/182; 174/260; 174/262
(58) Field of Classification Search ........ 156/182, 156/272.2, 221; 174/260, 261, 262; 361/760, 361/761; 29/830, 835, 844; *H05K 3/46*
    See application file for complete search history.

(56) References Cited

FOREIGN PATENT DOCUMENTS

| | | | |
|---|---|---|---|
| JP | 09-036551 A | | 2/1997 |
| JP | 2003-124380 | * | 4/2003 |
| JP | 2003-124380 A | | 4/2003 |
| JP | 2005-064447 | * | 3/2005 |
| JP | 2005-064447 A | | 3/2005 |
| JP | 2005-159074 | * | 6/2005 |
| JP | 2005-159074 A | | 6/2005 |

OTHER PUBLICATIONS

Official Communication issued in International Patent Application No. PCT/JP2008/073173, mailed on Mar. 31, 2009.

* cited by examiner

*Primary Examiner* — Khanh P Nguyen
*Assistant Examiner* — Vishal I Patel
(74) *Attorney, Agent, or Firm* — Keating & Bennett, LLP

(57) ABSTRACT

A method for manufacturing a multilayer wiring substrate processes a via hole without unnecessarily increasing the diameter thereof and which can easily achieve the formation of fine wiring. A first resin layer in a cured state is prepared in which at least one first via hole including a bottom made of a conductive pattern is formed by laser processing, a second resin layer in an uncured state is prepared in which at least one second via hole is formed to penetrate therethrough at a position corresponding to the first via hole, and the first resin layer and the second resin layer are laminated to each other so that the first via hole and the second via hole communicate with each other. After a conductive paste is simultaneously filled in the first via hole and the second via hole, a metal foil is pressure-bonded to the second resin layer, and the second resin layer and the conductive paste are simultaneously cured. Subsequently, the metal foil is patterned.

7 Claims, 12 Drawing Sheets

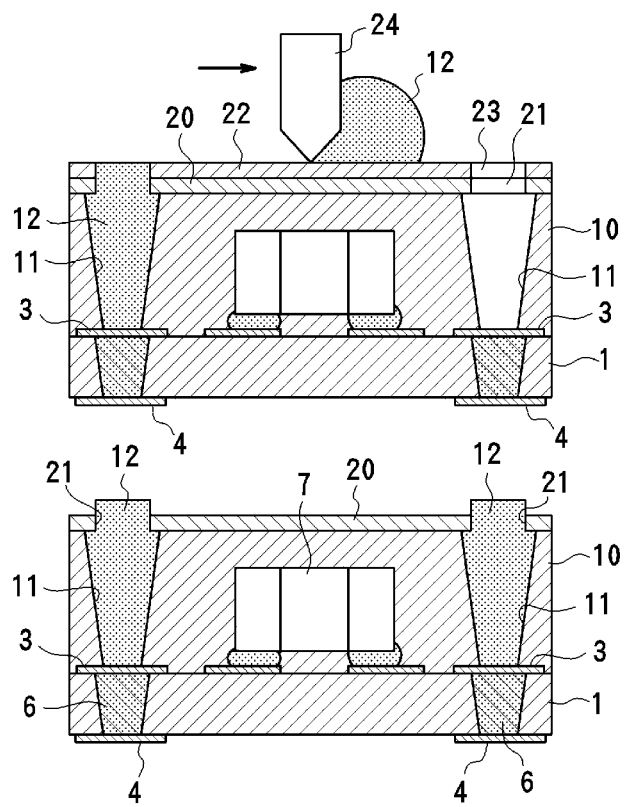
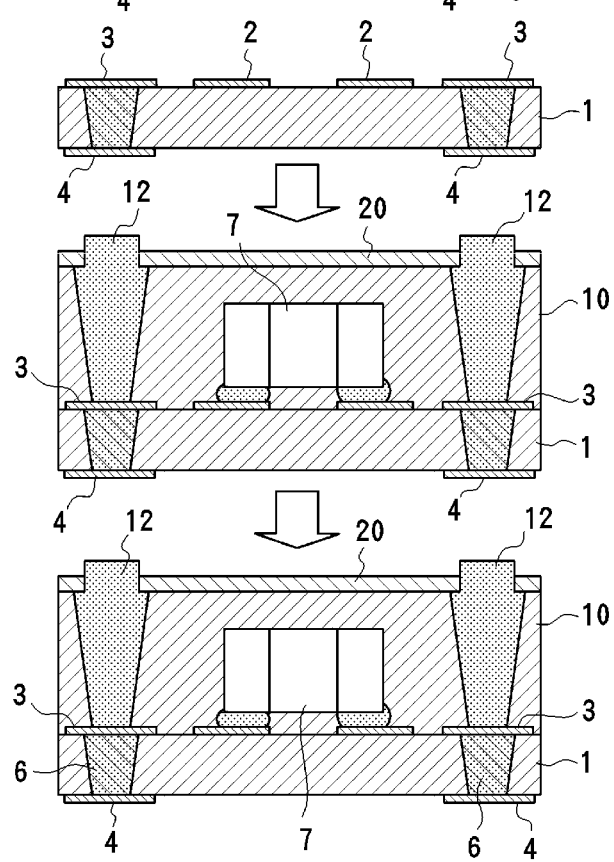
FIG. 6B (a)
FIG. 6B (b)
FIG. 6B (c)

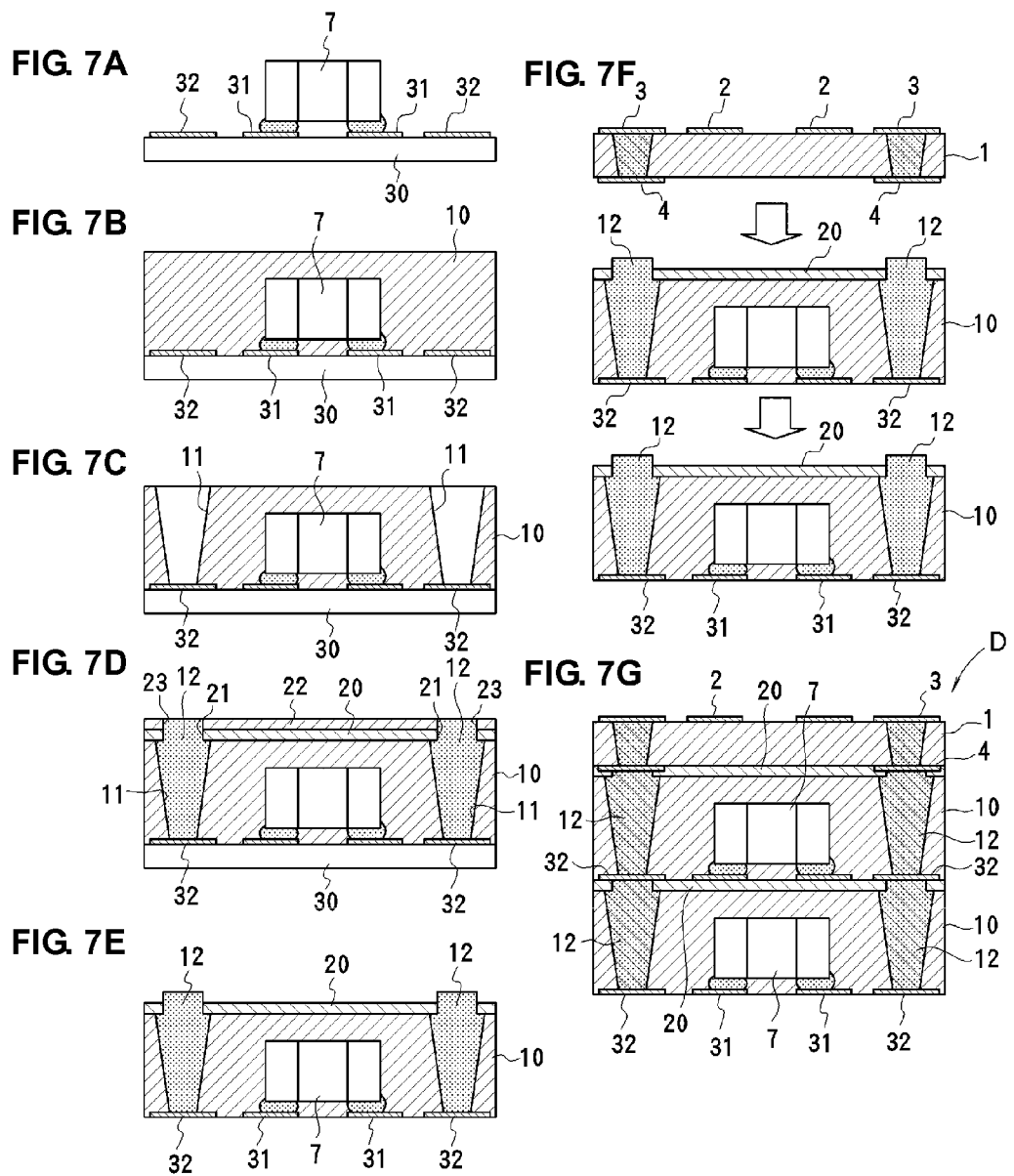

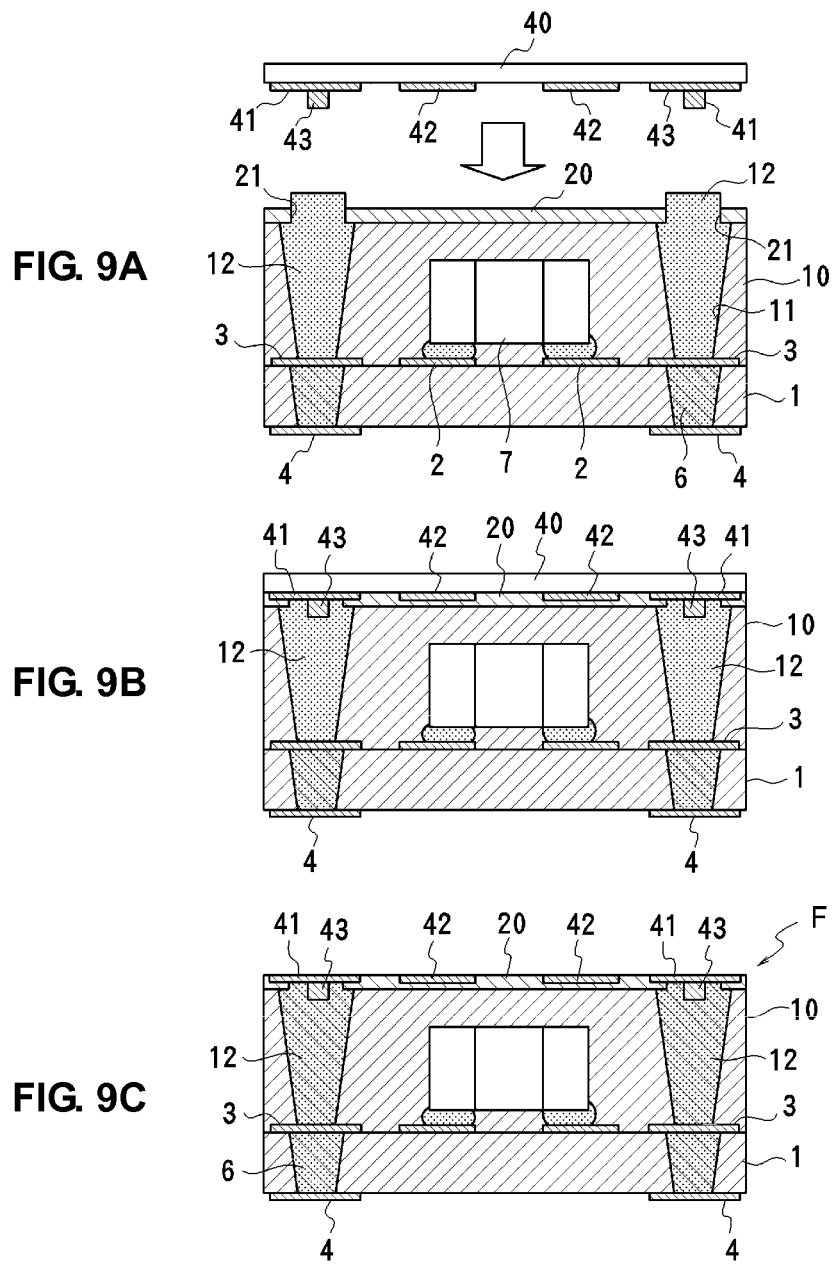

METHOD FOR MANUFACTURING MULTILAYER WIRING SUBSTRATE

BACKGROUND OF THE INVENTION

1. Field of the Invention

The present invention relates to a method for manufacturing a wiring substrate of a multilayer structure including vias.

2. Description of the Related Art

In recent years, concomitant with the trend toward high density mounting of components, a multilayer wiring substrate in which a plurality of wiring patterns is formed to have a multilayer structure has been used. As a method for manufacturing the multilayer wiring substrate as described above, Japanese Unexamined Patent Application Publication No. 9-36551 disclosed a technique in which a wiring pattern is formed on one surface of a hard substrate, an adhesive layer is formed on the other surface thereof, holes penetrating the hard substrate and the adhesive layer are formed to be in contact with the wiring pattern, and a conductive paste is filled in the above holes.

FIG. 11A shows one example of the manufacturing method disclosed in Japanese Unexamined Patent Application Publication No. 9-36551. As shown in FIG. 11A-(a), a hard resin substrate 100 provided with a metal foil 101 adhered on an upper surface thereof is prepared, and the metal foil 101 is processed by an etching treatment to form a wiring pattern 101a as shown in FIG. 11A-(b). Next, as shown in FIG. 11A-(c), an adhesive layer 102 is formed on one surface of the resin substrate 100, and subsequently by radiating laser from an adhesive layer side as shown in FIG. 11A-(d), continuous via holes 103 each penetrating the adhesive layer 102 and the resin substrate 100 are formed. In addition, as shown in FIG. 11A-(e), a conductive paste 104 is filled in the via holes 103, so that a single-sided circuit board can be obtained. At this stage, the adhesive layer 102 and the conductive paste 104 are both in an uncured state.

After a plurality of single-sided circuit substrates 105a to 105d which are formed by a method similar to that described above are laminated to each other as shown in FIG. 11B, the adhesive layers 102 and the conductive pastes 104 are simultaneously heat-cured, so that a multilayer wiring substrate as shown in FIG. 12 can be obtained.

When the via holes 103 each having a bottom made of the wiring pattern 101a are formed in the resin substrate 100 by laser processing as described above, a problem may arise in that the via holes 103 each have a tapered shape. The reason for this is that, in the via hole 103 having a bottom, since laser light must be weak to prevent the wiring pattern 101a which forms the bottom of the via hole 103 from being damaged by the laser light, energy of laser light reaching the bottom of the via hole 103 is reduced to a very low level. In the case of the via hole 103 having a tapered shape, since the diameter of the bottom of the via hole is small, in order to prevent a connection defect between the conductive paste 104 and the wiring pattern 101a at the bottom of the via hole, it is necessary to increase the diameter of an opening portion of the via hole 103. As a result, the pitch between the vias cannot be narrowed, and hence, formation of fine wiring is disadvantageously hindered. In particular, when the resin substrate 100 is a component-incorporating substrate, that is, when the resin substrate 100 incorporates a circuit component therein, since the thickness of the substrate is increased, the diameter of the opening portion of the via hole 103 is further increased.

In addition, in the conventional manufacturing method described above, since a laser is radiated to the resin substrate 100 provided with the adhesive layer 102 adhered thereto as shown in FIG. 11A-(d), the adhesive layer 102 in an uncured state is melted by heat, and hence the diameter of the via hole 103 in the adhesive layer 102 is unnecessarily increased. The increase in diameter as described above further hinders the formation of fine wiring in combination with the tapered shape of the via hole 103.

Furthermore, since a resin removed by laser radiation may adhere to the peripheries of the via holes 103 and/or the surface of the wiring pattern 101a, for example, a desmear treatment or a plasma treatment is necessarily performed to remove the above-described resin. However, by the method for removing smears described above, the uncured adhesive layer 102 is also simultaneously removed. As a result, smears are not appropriately removed, and hence electrical reliability may be degraded in some cases.

SUMMARY OF THE INVENTION

Accordingly, preferred embodiments of the present invention provide a method for manufacturing a multilayer wiring substrate which can process via holes without unnecessarily increasing the diameters thereof and which can easily achieve the formation of fine wiring.

A method for manufacturing a multilayer wiring substrate according to a first preferred embodiment of the present invention includes: a first step of preparing a first resin layer in a cured state which is provided with a conductive pattern and in which at least one first via hole including a bottom made of the conductive pattern is formed; a second step of preparing a second resin layer in an uncured state in which at least one second via hole is formed at a position corresponding to the first via hole to penetrate the second resin layer; a third step of laminating the first resin layer and the second resin layer so that the first via hole and the second via hole communicate with each other; a fourth step of simultaneously filling a conductive paste in the first via hole and the second via hole; a fifth step of performing pressure bonding of a metal foil to the second resin layer in which the second via hole is filled with the conductive paste so that the metal foil is brought into contact with the conductive paste; a sixth step of curing the second resin layer and the conductive paste after the fifth step; and a seventh step of patterning the metal foil to form a wiring pattern electrically connected to the conductive paste which is cured in the second via hole.

A method for manufacturing a multilayer wiring substrate according to a second preferred embodiment of the present invention includes: a first step of preparing a first resin layer in a cured state which is provided with a conductive pattern and in which at least one first via hole including a bottom made of the conductive pattern is formed; a second step of laminating a second resin layer in an uncured state on an upper surface of the first resin layer; a third step of forming at least one second via hole in the second resin layer at a position corresponding to the first via hole after the second step; a fourth step of simultaneously filling a conductive paste in the first via hole and the second via hole; a fifth step of performing pressure bonding of a metal foil to the second resin layer in which the second via hole is filled with the conductive paste so that the metal foil is brought into contact with the conductive paste; a sixth step of curing the second resin layer and the conductive paste after the fifth step; and a seventh step of patterning the metal foil to form a wiring pattern electrically connected to the conductive paste which is cured in the second via hole.

A method for manufacturing a multilayer wiring substrate according to a third preferred embodiment of the present invention includes: a first step of preparing a first resin layer in a cured state which is provided with a conductive pattern and in which at least one first via hole including a bottom made of the conductive pattern is formed; a second step of preparing a second resin layer in an uncured state in which at least one second via hole is formed at a position corresponding to the first via hole to penetrate the second resin layer; a third step of laminating the first resin layer and the second resin layer so that the first via hole and the second via hole communicate with each other; a fourth step of simultaneously filling a conductive paste in the first via hole and the second via hole; a fifth step of performing pressure bonding of a substrate provided with a wiring pattern on a surface thereof to the second resin layer so that the conductive paste filled in the second via hole and the wiring pattern are brought into contact with each other; and a sixth step of curing the second resin layer and the conductive paste after the fifth step.

A method for manufacturing a multilayer wiring substrate according to a fourth preferred embodiment of the present invention includes: a first step of preparing a first resin layer in a cured state which is provided with a conductive pattern and in which at least one first via hole including a bottom made of the conductive pattern is formed; a second step of laminating a second resin layer in an uncured state on an upper surface of the first resin layer; a third step of forming at least one second via hole in the second resin layer corresponding to the first via hole after the second step; a fourth step of simultaneously filling a conductive paste in the first via hole and the second via hole; a fifth step of performing pressure bonding of a substrate provided with a wiring pattern on a surface thereof to the second resin layer so that the conductive paste filled in the second via hole and the wiring pattern are brought into contact with each other; and a sixth step of curing the second resin layer and the conductive paste after the fifth step.

Hereinafter, the method for manufacturing a multilayer wiring substrate according to the first preferred embodiment of the present invention will be described. First, in the first step, a first resin layer in a cured state which is provided with a conductive pattern and in which at least one first via hole including a bottom made of the conductive pattern is prepared. In order to obtain the first resin layer as described above, for example, after an uncured resin layer is pressure-bonded to a surface of a base member provided with a conductive pattern formed thereon, the first resin layer may be formed by curing the resin layer. Furthermore, the first via hole including a bottom made of the conductive pattern is formed in this first resin layer, and in this step, laser processing may be used. When the first via hole including a bottom made of the conductive pattern is formed by laser processing, the via hole inevitably has a tapered shape. Although a resin removed by laser radiation may adhere to the periphery of the via hole and/or the surface of the wiring pattern, since the first resin layer is a cured resin plate, the resin can be easily removed, for example, by a wet desmear treatment or a dry plasma treatment.

Next, a second resin layer in an uncured state in which at least one second via hole is formed at a position corresponding to the first via hole is laminated on the first resin layer so that the first via hole and the second via hole communicate with each other. Since being formed independently of the first via hole in the first resin layer, the second via hole in the second resin layer is not influenced by the increase in diameter of the first via hole. That is, even when the opening diameter of the first via hole is increased by laser processing, the diameter of the second via hole can be made small independent of the opening diameter of the first via hole, and hence the formation of fine wiring can be realized. In addition, since being a penetrating hole, the second via hole can be easily formed by another method, such as drill processing or punching processing, as well as laser processing.

Furthermore, a conductive paste is simultaneously filled in the first via hole and the second via hole, and a metal foil is pressure-bonded to the second resin layer in which the second via hole is filled with the conductive paste so as to be brought into contact with the conductive paste. Subsequently, the second resin layer and the conductive paste are cured, and the metal foil is patterned, so that a wiring pattern electrically connected to the conductive paste which is cured in the second via hole is formed. When the metal foil is pressure-bonded to the second resin layer, the positional accuracy in lamination is not required. In addition, when the first resin layer and the second resin layer are laminated to each other, the pitch of the first via holes must correspond to the pitch of the second via holes; however, when the diameter of the second via hole is made smaller than the opening diameter of the first via hole, a slight pitch shift can be absorbed.

In the case of the second preferred embodiment, in a manner different from that of the first preferred embodiment, after a second resin layer in which no second via holes are formed is laminated on the first resin layer, at least one second via hole is processed. As a processing method of the second via hole, a laser is preferably radiated. In the case described above, although smears of the second resin layer are generated by laser radiation, since the first via hole is already formed in the first resin layer, the amount of smears thus generated is very small, and particular removal thereof may not be performed. The diameter of the second via hole may be smaller than the opening diameter of the first via hole.

In the third preferred embodiment, instead of the metal foil in the fifth step according to the first preferred embodiment, a substrate provided with a wiring pattern on a surface thereof is preferably used, and this substrate is pressure-bonded to the second resin layer so that the conductive paste filled in the second via hole and the wiring pattern are brought into contact with each other. Subsequently, the second resin layer and the conductive paste are cured. When the second via hole and the wiring pattern are connected to each other, the pitch of the second via holes must accurately correspond to the pitch of the wiring pattern. On the other hand, although the pitch of the first via holes and the pitch of the second via holes must correspond to each other, when the diameter of the second via hole is made smaller than the opening diameter of the first via hole, slight pitch shift can be absorbed. In the third preferred embodiment, since the wiring pattern is formed beforehand on the substrate, after the second resin layer is cured, pattern formation is not required.

In the fourth preferred embodiment, instead of the metal foil in the fifth step according to the second preferred embodiment, a substrate provided with a wiring pattern on a surface thereof is preferably used. Also in this case, after the second resin layer is cured, pattern formation is not required.

The first resin layer and the second resin layer of various preferred embodiments of the present invention may be formed from various resin materials, such as an epoxy resin, a polyimide resin, an acrylic resin, and a phenol resin, a mixture of a thermosetting resin and an inorganic filler, or a composite material in which glass fibers or carbon fibers are impregnated with a thermosetting resin, for example.

According to another preferred embodiment of the present invention, after a circuit component is mounted on the conductive pattern provided on the first resin layer and is then buried in a resin layer in an uncured state, the resin layer may be cured so as to obtain the first resin layer in which the circuit component is embedded. In the case described above, since the first resin layer is a component-incorporating substrate in which the circuit component is embedded, the thickness of the first resin layer is increased, and the opening diameter of the first via hole is liable to increase. However, since the second via hole in the second resin layer can be formed independent of the first via hole in the first resin layer, the second via hole can be made smaller than the opening diameter of the first via hole, and even when the first resin layer has a large thickness, the formation of fine wiring is not hindered.

Although the substrates of the third and the fourth preferred embodiments may be a resin substrate on which a wiring pattern is formed beforehand, a carrier may be used as the substrate in such a way that the carrier is pressure-bonded to the second resin layer and is then peeled away after the sixth step in which the second resin layer and the conductive paste are cured. In the case described above, a wiring pattern made of a metal foil is formed on the surface of the second resin layer (in a cured state).

A convex portion may be formed on the exposed surface of the wiring pattern of the substrate according to the third and the fourth preferred embodiments and may be inserted into the second via hole when the substrate is pressure-bonded to the second resin layer. In the case described above, the convex portion inserted into the second via hole is buried in the conductive paste filled in the second via hole, so that an anchor effect can be obtained. That is, when the first resin layer and the substrate are pressure-bonded to each other with the second resin layer interposed therebetween, the convex portion prevents a lateral shift, and hence alignment of the wiring pattern with the first and the second via holes can be accurately performed. Furthermore, since the convex portion is buried in the conductive paste, an inner pressure thereof is increased, and the density of a conductive material in the conductive paste is also increased, so that the resistance can be decreased.

As described above, in the method for manufacturing a multilayer wiring substrate according to the first preferred embodiment of the present invention, after the second resin layer in an uncured state in which at least one second via hole is formed is laminated on the first resin layer in a cured state in which at least one first via hole including a bottom made of the conductive pattern is formed, and the conductive paste is filled in both the via holes, the metal foil is pressure-bonded and is then patterned after the second resin layer and the conductive paste are cured. As a result, the second via holes can be formed with a narrow pitch without receiving any influences of the diameter of the first via hole. Accordingly, the diameter of the second via hole can be formed to have a size corresponding to the wiring pattern, and the formation of fine wiring can be realized. In addition, since smears generated when the first via hole is processed can be easily removed by a known method before the second resin layer is laminated, a multilayer wiring substrate having high electrical reliability can be obtained. Furthermore, since the wiring pattern on an upper surface of the second resin layer is formed in such a way that the metal foil is pressure-bonded to the second resin layer and is then patterned, accurate alignment between the metal foil and the first and the second resin layers is not required, and hence the manufacturing process can be simplified.

In the method for manufacturing a multilayer wiring substrate according to the second preferred embodiment of the present invention, after the second resin layer in which no second via holes are formed is laminated on the first resin layer in which the first via hole is formed, since the second via hole is processed, the second resin layer is not required to be accurately aligned with the first resin layer, and hence the manufacturing process can be simplified. Furthermore, the second via holes can be formed with a narrow pitch without receiving any influences of the diameter of the first via hole. In addition, since smears generated when the first via hole is processed can be removed before the second resin layer is laminated, the removal of smears can be easily performed by a known method, and hence a multilayer wiring substrate having high electrical reliability can be obtained.

In the methods for manufacturing a multilayer wiring substrate according to the third and the fourth preferred embodiments of the present invention, since the substrate provided with a wiring pattern formed beforehand is pressure-bonded to the second resin layer, it is not necessary to form the wiring pattern later, and hence further multilayer formation can be easily realized.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6B(a) to 6B(c) are views showing a second half of the manufacturing process for the multilayer wiring substrate shown in FIG. 5.

FIGS. 7A to 7G are views showing a manufacturing process according to a fourth example of the multilayer wiring substrate according to a preferred embodiment of the present invention.

FIGS. 9A to 9C are views showing a manufacturing process according to a sixth example of the multilayer wiring substrate according to a preferred embodiment of the present invention.

DETAILED DESCRIPTION OF THE PREFERRED EMBODIMENTS

Hereinafter, preferred embodiments of the present invention will be described with reference to examples.

Example 1

Figure 1:
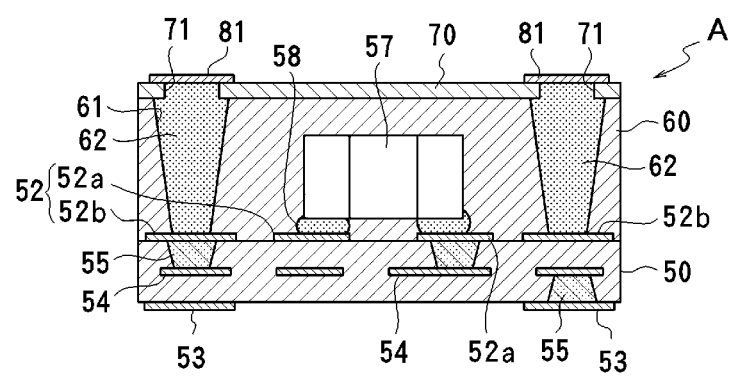
FIG. 1 is a cross-sectional view of a first example of a multilayer wiring substrate according to a preferred embodiment of the present invention.

FIG. 1 is a cross-sectional view of a first example of a multilayer wiring substrate according to a preferred embodiment of the present invention. A multilayer wiring substrate A of this example is preferably formed as a component-incorporating module in which a circuit component is embedded.

The multilayer wiring substrate A preferably has a three-layer structure. The bottommost layer (first layer) is a core substrate (such as an LTCC substrate) 50 provided with a wiring structure, and wiring patterns 52, 53, and 54 are formed on a front and a rear surface of the substrate and inside thereof. Among the wiring patterns, the wiring pattern 52 on the front surface includes mounting lands 52a for mounting a circuit component and via lands 52b. The wiring pattern 53 on the rear surface is a pattern for terminal electrodes. Between the wiring pattern 52 on the front surface and the inside wiring pattern 54 and between the inside wiring pattern 54 and the wiring pattern 53 on the rear surface, via conductors 55 are formed, and the wiring patterns 52, 53, and 54 are electrically connected to each other. As is well known, the via conductor 55 can be formed by filling a conductive paste in a via hole, followed by curing, for example. A circuit component 57 is mounted by soldering 58 on the mounting lands 52a provided on the core substrate 50. In addition, a solder resist (not shown) may be appropriately formed around the mounting land 52a. In FIG. 1, although a two-terminal chip component is shown as the circuit component 57 by way of example, a multi-terminal electronic component (such as an integrated circuit) may also be used. Besides soldering, a known arbitrary method may be used as the mounting method.

The circuit component 57 is embedded in a resin layer (first resin layer) 60 functioning as an intermediate layer. The resin layer 60 is composed of a substrate which is formed from a thermosetting resin, such as an epoxy resin or a phenol resin, a mixture in which an inorganic filler is mixed with a thermosetting resin, or a composite material in which glass fibers or carbon fibers are impregnated with a thermosetting resin. Via holes 61 are formed in the resin layer 60 in the thickness direction at positions corresponding to the via lands 52b provided on the core substrate 50, and a conductive paste 62 is filled in the via holes 61 and is then cured. The via holes 61 are each formed by laser processing.

The topmost layer is an adhesive layer (second resin layer) 70 having a small thickness. As a material for the adhesive layer 70, the same type material as that for the resin layer 60 is preferably used. Via holes 71 are formed in the adhesive layer 70 at positions corresponding to the via holes 61 in the resin layer 60 so as to communicate with the via holes 61, and the conductive paste 62 is also filled in this via holes 71 continuously from the via holes 61 and is then cured. On an upper surface of the adhesive layer 70, a wiring pattern 81 is formed so as to be in contact with the conductive paste 62. As a result, the wiring pattern 81 on the adhesive layer 70 and the via lands 52b on the surface of the core substrate 50 are electrically connected to each other with the via conductors formed in the resin layer 60.

In the multilayer wiring substrate A shown in FIG. 1, as the core substrate 50, an LTCC substrate having a multilayer structure is preferably used. However, the core substrate 50 is not limited thereto, and for example, a circuit board such as a printed circuit board may also be used. In the case described above, a substrate is preferable in which electrodes are provided on an upper and a lower surface thereof and are electrically connected to each other through via conductors provided inside.

Figure 2A:
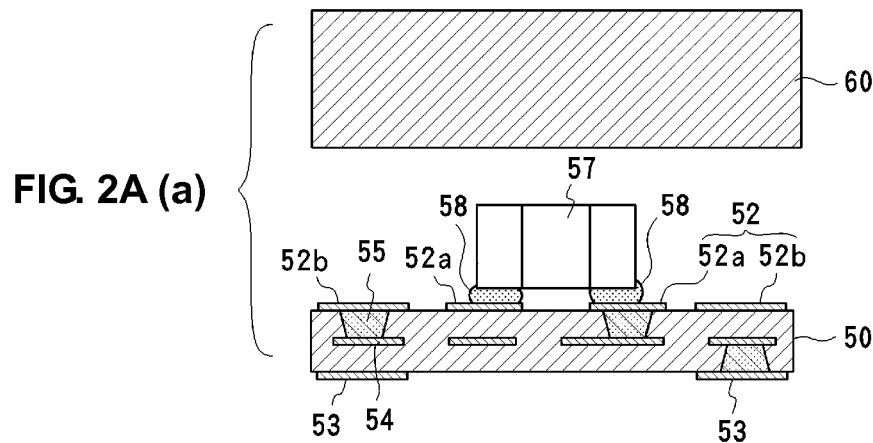
FIGS. 2A(a) to 2A(d) are views showing a first half of a manufacturing process for the multilayer wiring substrate shown in FIG. 1.
Figure 2A:
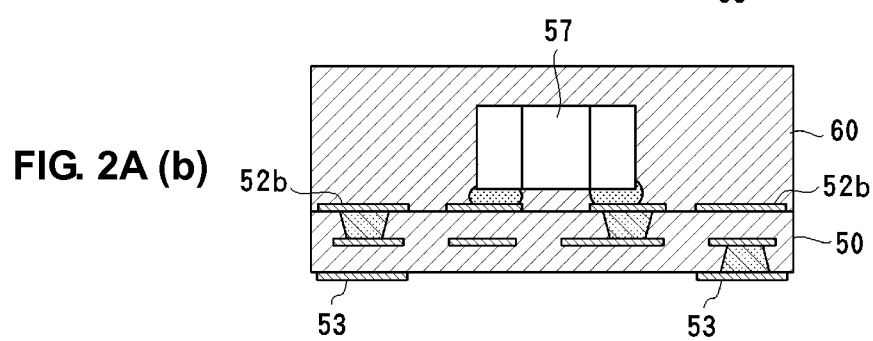
Figure 2A:
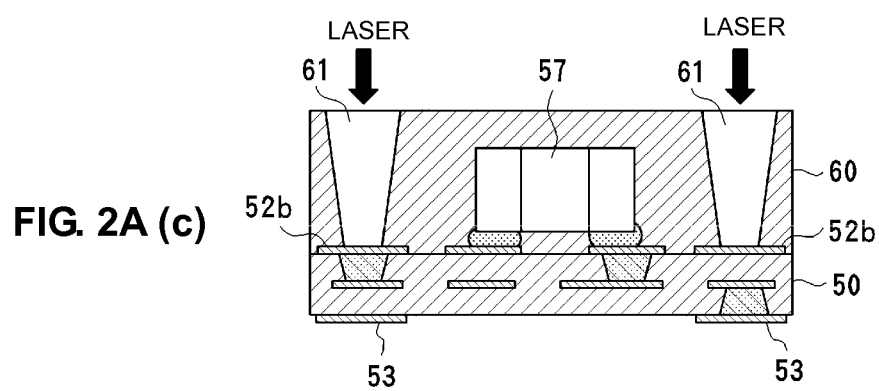
Figure 2A:
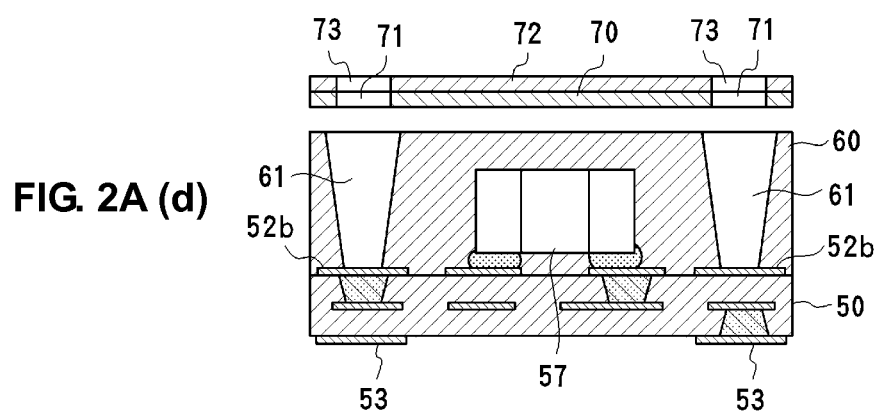
Figure 2B:
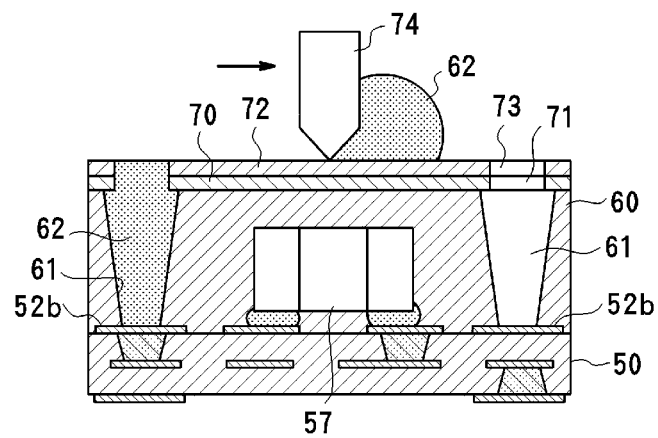
FIGS. 2B(a) to 2B(d) are views showing a second half of the manufacturing process for the multilayer wiring substrate shown in FIG. 1.
Figure 2B:
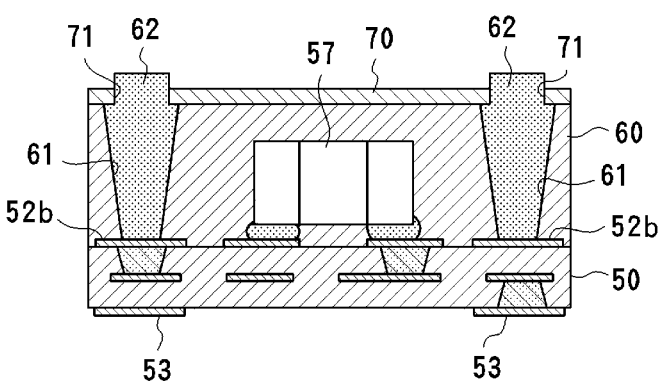
Figure 2B:
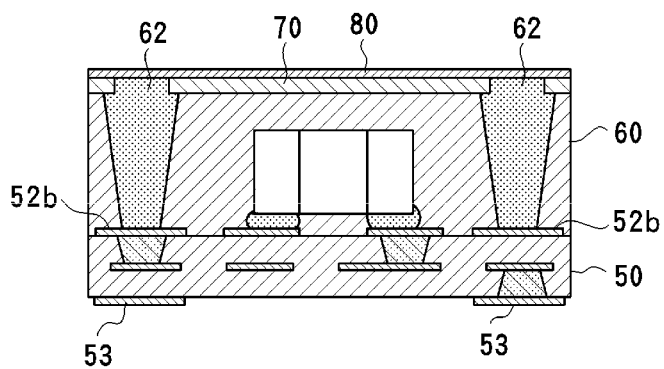
Figure 2B:
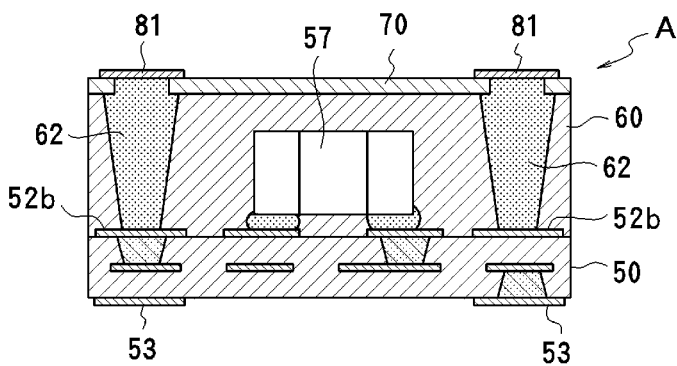

Next, one example a manufacturing method of the multilayer wiring substrate A having the above-described structure will be described with reference to FIGS. 2A and 2B. FIG. 2A shows a first half of a manufacturing process, and FIG. 2B shows a second half of the manufacturing process. In this example, a method for manufacturing the multilayer wiring substrate A in the form of a daughter substrate will be described; however, multilayer wiring substrates are actually manufactured in the form of a collective substrate and are then divided into daughter substrates.

As shown in FIG. 2A-(a), the core substrate 50 is prepared, and the circuit component 57 is mounted on the mounting lands 52a. In addition, besides the core substrate 50, the resin layer 60 in an uncured state is prepared. The uncured state indicates a semi-cured state (such as a B stage) or a state which is softer than the above state.

Next, as shown in FIG. 2A-(b), the resin layer 60 having a thickness larger than the height of the circuit component 57 is overlapped on the core substrate 50 and is then pressure-bonded thereto. When the resin layer 60 is pressure-bonded, a softened resin enters the gap between the circuit component 57 and the core substrate 50, so that the circuit component 57 is embedded in the resin layer 60. In addition, by performing vacuum pressing in pressure bonding, air bubbles and voids are prevented from being formed in the resin layer 60, and the resin can be more easily filled. When heating is performed simultaneously with the pressure bonding of the resin layer 60 or after the pressure bonding thereof, the resin layer 60 is cured, so that the core substrate 50 and the resin layer 60 are united. In this step, the temperature is preferably, for example, in the range of approximately 180° C. to 200° C., and the pressure is preferably, for example, in the range of approximately 0.5 to 5.0 MPa. By the resin layer 60 provided with the mounting lands 52a and the via lands 52b at the bottom surface, the first resin layer is formed.

Next, as shown in FIG. 2A-(c), laser light is radiated from above the cured resin layer 60, so that the via hole 61 having a bottom made of the via land 52b is processed. During laser processing, since energy of the laser light is attenuated toward the bottom of the via hole 61, the via hole has a tapered shape in which the diameter thereof decreases toward the bottom. In particular, when the thickness of the resin layer 60 is increased since the circuit component 57 is embedded therein, the diameter of an opening portion of the via hole 61 tends to increase. After the laser processing, a desmear treatment is performed to wash the via bottom. In particular, when a component is embedded, since the via depth is increased, smears may not be effectively removed by a dry plasma treatment or the like in some cases. In the case described above, a wet desmear treatment is effective.

Next, as shown in FIG. 2A-(d), the adhesive layer 70 in an uncured state lined by a protective film 72, such as a PET film, is disposed on an upper surface of the resin layer 60 in which the via holes 61 are formed and is then pressure-bonded by applying heat and pressure. In this step, the temperature is set, for example, to approximately 50° C. to 120° C. at which the adhesive layer 70 is not cured, and the pressure is preferably set to approximately 0.5 MPa to 5.0 MPa, for example. As the adhesive layer 70, a semi-cured resin sheet having a small thickness of about 10 µm to about 50 µm may preferably be used, for example. The via holes 71 and via holes 73 are formed beforehand in the adhesive layer 70 and the protective film 72, respectively, to penetrate therethrough in the thickness direction, and when the adhesive layer 70 and the protective film 72 are pressure-bonded, alignment is performed using a known method, such as pin lamination, so that the via holes 71 and 73 accurately correspond to the via holes 61 and the via lands 52b. The via holes 71 and 73 can be processed by a known method, such as punching or drilling processing, as well as laser processing. Although the diameters of the via holes 71 and 73 may be the same as that of the opening portion of the via hole 61, a hole having a smaller diameter than the diameter at the opening portion of the via hole 61 can be formed. Hence, the via holes 71 and 73 can be formed with a narrow pitch in accordance with the via land 52b provided on the core substrate 50. Since being formed of an uncured thermosetting resin, when the adhesive layer 70 is pressure-bonded to the cured resin layer 60, a very tight adhesion therebetween can be obtained.

FIG. 2B-(a) shows the state in which the conductive paste 62 is collectively filled in the via holes 61 and the via holes 71 and 73 by vacuum printing while the adhesive layer 70 and the protective film 72 are adhered to the upper surface of the resin layer 60. In this step, since a squeegee 74 is slid along a rear surface of the protective film 72, the adhesive layer 70 is not damaged.

FIG. 2B-(b) shows the state in which after the conductive paste 62 is filled in the via holes 61, 71, and 73, the protective film 72 is peeled away. In the state described above, the conductive paste 62 partly protrudes above the adhesive layer 70 by a length corresponding to the thickness of the protective film 72.

FIG. 2B-(c) shows the state in which a metal foil 80, such as a copper foil, is pressure-bonded to the upper surface of the adhesive layer 70 which is formed in FIG. 2B-(b). In this step, since the metal foil 80 is pressure-bonded to the entire surface of the adhesive layer 70, accurate alignment is not required. Since the adhesive layer 70 is in an uncured state, and the conductive paste 62 is also in an uncured state, when the metal foil 80 is pressure-bonded, the metal foil 80 can be tightly adhered to the adhesive layer 70 and the conductive paste 62 without forming any gaps therebetween. During the pressure-bonding, the adhesive layer 70 and the conductive paste 62 are preferably cured at the same time while a temperature of approximately 180° C. to 200° C. and a pressure of approximately 0.5 MPa to 5.0 MPa, for example, are applied.

After the adhesive layer 70 and the conductive paste 62 are cured, the metal foil 80 is patterned as shown in FIG. 2B-(d), so that the wiring pattern 81 electrically connected to the cured conductive paste 62 can be formed. A known method can be used for the pattern formation of the metal foil 80. As described above, the multilayer wiring substrate A shown in FIG. 1 is completed. Since the conductive paste 62 is collectively filled in the via holes 61 and 71, a conductive material can be uniformly dispersed from the via holes 61 to 71, and hence the resistance can be decreased.

Figure 3:
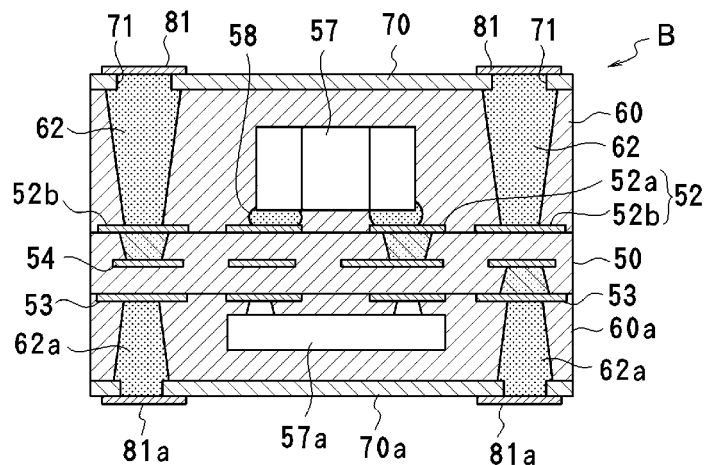
FIG. 3 is a cross-sectional view of a modified example of the multilayer wiring substrate shown in FIG. 1.

FIG. 3 shows one modified example of the multilayer wiring substrate A of the first example. In this wiring substrate B, besides the circuit component 57 mounted at an upper surface side of the core substrate 50, a circuit component 57a is also mounted at a lower surface side thereof, and a resin layer 60a is formed at the lower surface side of the core substrate 50 so that this circuit component 57a is embedded in the resin layer 60a. Furthermore, an adhesive layer 70a is formed on a lower surface of the resin layer 60a located at the lower surface side, and a wiring pattern 81a is formed on a surface of the adhesive layer 70a. The wiring pattern 81a is electrically connected to the electrodes 53 on a lower surface of the core substrate 50 by a conductive paste 62a filled in via holes and cured. In the case described above, since the circuit components 57 and 57a can be mounted on the two sides of the core substrate 50, a module having higher performance can be obtained.

Example 2

Figure 4A:
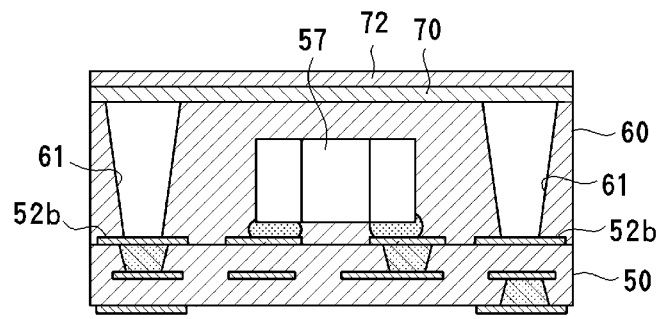
FIGS. 4A and 4B are views partly showing a manufacturing process according to a second example of the multilayer wiring substrate according to a preferred embodiment of the present invention.
Figure 4B:
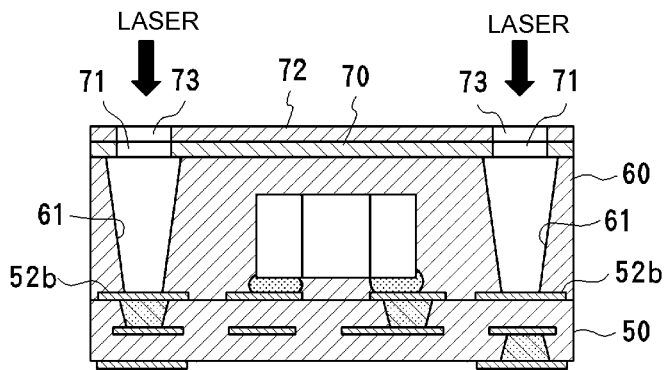

FIG. 4 shows a second example of a manufacturing method of a multilayer wiring substrate according to a preferred embodiment of the present invention. Elements corresponding to those in the first example are designated by the same reference numerals, and a duplicate description thereof is omitted. FIG. 4 shows steps which replace the step (d) of FIG. 2A. In FIG. 2A-(d), the adhesive layer 70 and the protective film 72, in which the via holes 71 and 73 are formed beforehand, are adhered onto the resin layer 60; however, in FIG. 4-(a), the adhesive layer 70 and the protective film 72 in which no via holes are formed are adhered. Hence, alignment of the adhesive layer 70 and the protective film 72 to the resin layer 60 is not required.

In FIG. 4-(b), positions corresponding to the via holes 61 and the via lands 52b are irradiated with a laser, so that the via holes 71 and 73 are formed in the adhesive layer 70 and the protective film 72, respectively. By the formation of the via holes 71 and 73, although smears may be adhered to an inner wall of the via holes 71, since the adhesive layer 70 is very thin, the amount of smears is very small. In addition, smears generated when the via holes 61 are formed in the resin layer 60 are removed before the adhesive layer 70 is laminated thereon. Hence, the influence of smears on degradation in reliability is small. The via holes 71 and 73 may not be formed at position corresponding to the via holes 61 but may be formed in accordance with the pitch of the via lands 52b provided on the core substrate 50, and the diameters of the via holes 71 and 73 may be each smaller than the diameter at the opening portion of the via hole 61. After the step described above, steps to be performed are similar to those shown those in FIG. 2B, and a final structure of the multilayer wiring substrate is also similar to that of the first example.

Example 3

Figure 5:
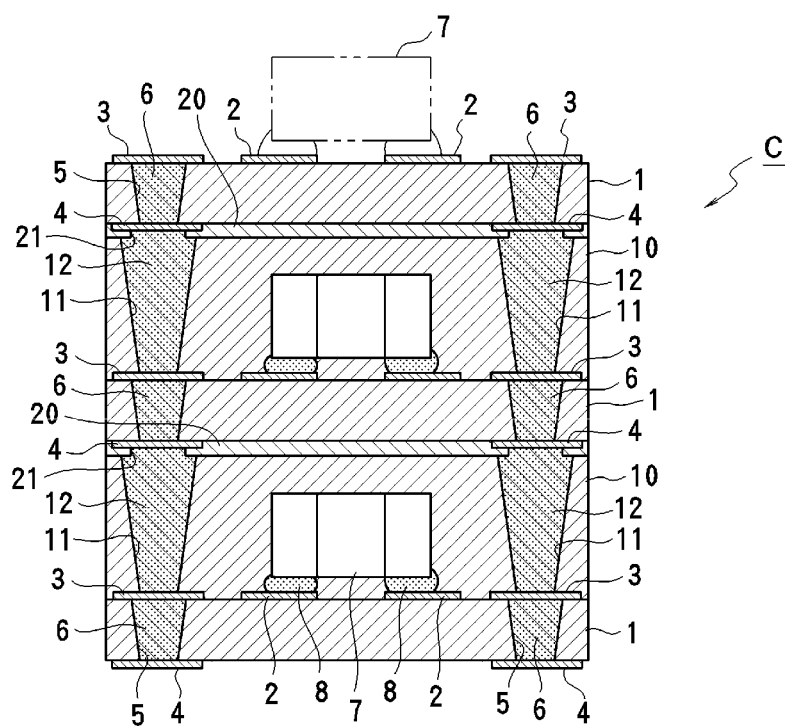
FIG. 5 is a view showing a manufacturing process according to a third example of the multilayer wiring substrate according to a preferred embodiment of the present invention.

FIG. 5 is a cross-sectional view of a third example of the multilayer wiring substrate according to a preferred embodiment of the present invention. A multilayer wiring substrate C of this example is preferably formed as a component-incorporating module in which a circuit component is embedded.

The multilayer wiring substrate C preferably is a laminate of five resin layers. A topmost layer, a third layer, and a bottommost layer are each a core substrate 1 (such as a printed-circuit board) provided with a wiring structure, and wiring patterns 2 to 4 are formed at a predetermined pitch on a front and a rear surface of the substrate. Among the wiring patterns, mounting lands 2 mounting a circuit component and via lands 3 are formed on the front surface, and via lands 4 are formed on the rear surface at positions corresponding to the via lands 3. Via holes 5 are formed between the via lands 3 and 4 provided on the front and the rear surfaces, respectively, and when a conductive paste 6 is filled in the via holes 5 and is then cured, the via lands 3 and 4 are electrically connected to each other. Circuit components 7 are mounted by solder 8 on the mounting lands 2 provided on the third-layer core substrates 1 and on the mounting lands 2 provided on the bottommost-layer core substrates 1. In this case, a solder resist (not shown)

may be appropriately formed around the mounting land 2. A circuit component 7 may also be mounted on the mounting lands 2 provided on the topmost-layer core substrate 1. In FIG. 5, although a two-terminal chip component is shown as the circuit component 7 by way of example, a multi-terminal electronic component (such as an integrated circuit) may also be used.

The circuit components 7 are embedded in a second-layer and a fourth-layer resin layer (first resin layer) 10. This resin layer 10 is composed of a substrate which is formed from a thermosetting resin, such as an epoxy resin or a phenol resin, a mixture in which an inorganic filler is mixed with a thermosetting resin, or a composite material in which glass fibers or carbon fibers are impregnated with a thermosetting resin. Via holes 11 are formed in the resin layer 10 in the thickness direction at positions corresponding to the via lands 3 and 4 provided on the core substrate 1, and a conductive paste is filled in the via holes 11 and is then cured. The via holes 11 are formed by laser processing.

The topmost-layer core substrate 1 and the second-layer resin layer 10 are laminated and fixed to each other with an adhesive layer (second resin layer) 20 interposed therebetween, and the third-layer core substrate 1 and the fourth-layer resin layer 10 are laminated and fixed to each other with an adhesive layer (second resin layer) 20 interposed therebetween. The adhesive layer 20 and the resin layer 10 are preferably formed from the same type of thermosetting resin. Via holes 21 are formed in the adhesive layer 20 at positions corresponding to the via holes 11 formed in the resin layer 10 so as to communicate therewith and are also continuously filled with the conductive paste 12. As a result, the via lands 3 and 4 of the core substrates 1 located at an upper side and a lower side are electrically connected to each other, the core substrates 1 being sandwiched by the resin layer 10 and the adhesive layer 20 (second resin layer) provided therebetween.

In the multilayer wiring substrate C shown in FIG. 5, as the topmost-layer, the third-layer, and the bottommost-layer substrates 1, the core substrates having the same shape are preferably used. However, the core substrates are not limited thereto, and core substrates having different structures may also be used. In this case, via holes 5 are preferably formed so as to electrically connect electrodes located at a front and a rear surface. In a manner similar to that described above, although the second-layer and the fourth-layer resin layers 10 are also designed preferably to have the same structure, they may have different structures from each other. The via holes 11 and 21 are not limited to those provided in the periphery portion of the multilayer wiring substrate C and may be provided in the central portion thereof.

Figure 6A:
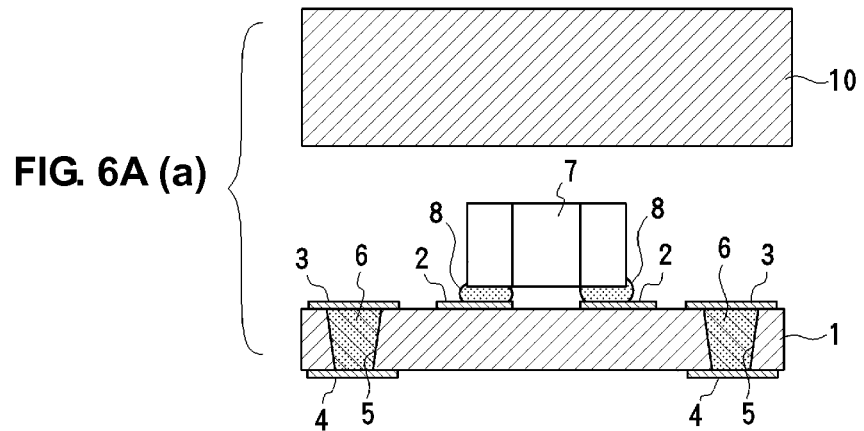
FIGS. 6A(a) to 6A(d) are views showing a first half of a manufacturing process for the multilayer wiring substrate shown in FIG. 5.
Figure 6A:
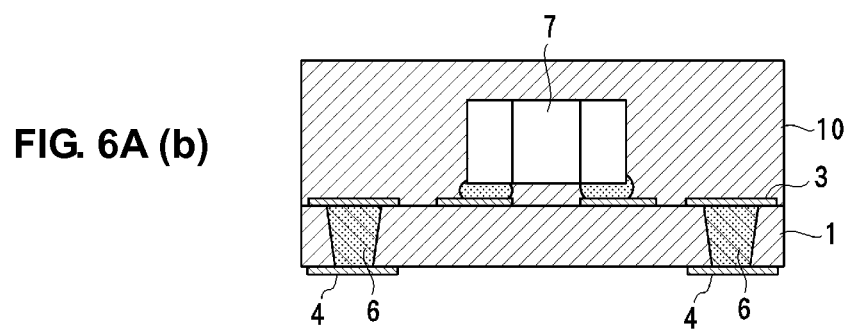
Figure 6A:
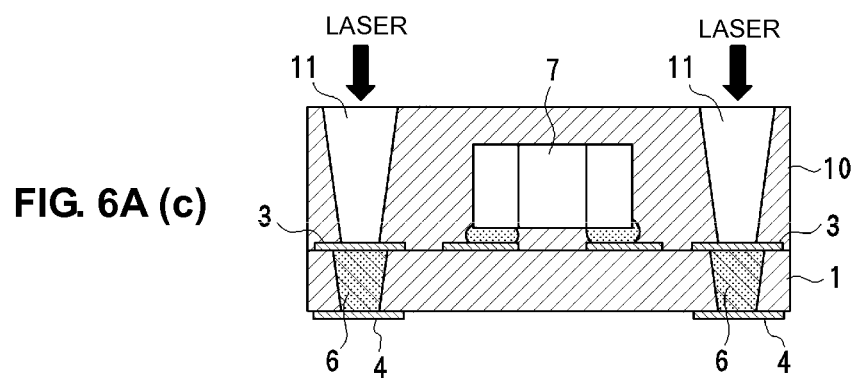
Figure 6A:
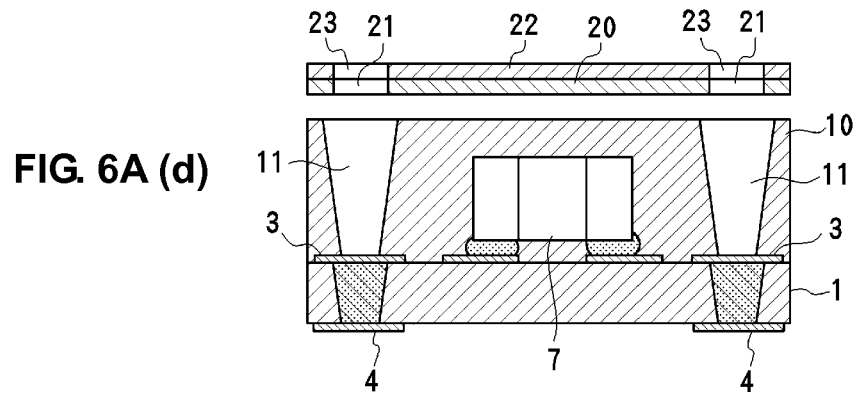

Next, one example of a manufacturing method of the multilayer wiring substrate C having the above-described structure will be described with reference to FIGS. 6A and 6B. FIG. 6A shows a first half of a manufacturing process, and FIG. 6B shows a second half of the manufacturing process. In this example, a method for manufacturing the multilayer wiring substrate C in the form of a daughter substrate will be described; however, multilayer wiring substrates are actually manufactured in the form of a collective substrate and are then divided into daughter substrates.

As shown in FIG. 6A-(a), the core substrate 1 is prepared, and the circuit component 7 is mounted on the mounting lands 2. The core substrate 1 is formed by a known printed-wiring technique. In addition, besides this core substrate 1, the resin layer 10 in an uncured state is also prepared. The uncured state indicates a semi-cured state (such as a B stage) or a state which is softer than the above state.

Next, as shown in FIG. 6A-(b), the resin layer 10 having a thickness larger than the height of the component is overlapped on the core substrate 1 and is then pressure-bonded thereto. When the resin layer 10 is pressure-bonded, a softened resin enters the gap between the circuit component 7 and the core substrate 1, so that the circuit component 7 is embedded in the resin layer 10. When heating is performed simultaneously with the pressure bonding of the resin layer 10 or after the pressure bonding thereof, the resin layer 10 is cured, and the core substrate 1 and the resin layer 10 are united. By the resin layer 10 provided with the mounting lands 2 and the via lands 3 at the bottom surface, the first resin layer is formed.

Next, as shown in FIG. 6A-(c), laser light is radiated from above the cured resin layer 10, so that the via holes 11 each having a bottom made of the via land 3 are processed. During the laser processing, since energy of the laser light is attenuated toward the bottom of the via hole 11, the via hole 11 has a tapered shape in which the diameter thereof decreases toward the bottom side.

Next, as shown in FIG. 6A-(d), the adhesive layer 20 lined by a protective film 22 is disposed on an upper surface of the resin layer 10 provided with the via holes 11 formed therein and is then pressure-bonded by applying heat and pressure. The via holes 21 and via holes 23 are formed beforehand in the adhesive layer 20 and the protective film 22, respectively, to penetrate therethrough in the thickness direction, and when the adhesive layer 20 and the protective film 22 are pressure-bonded, alignment is performed using a known method, such as pin lamination, so that the via holes 21 and 23 accurately correspond to the via holes 11 and the via lands 3. Since the via holes 21 and 23 may have a diameter smaller than that at an opening portion of the via hole 11, the via holes 21 and 23 can be formed with a narrow pitch so as to correspond to the via lands 3 provided on the core substrate 1. Since the adhesive layer 20 being formed of an uncured thermosetting resin, when the adhesive layer 20 is pressure-bonded to the cured resin layer 10, a very tight adhesion therebetween can be obtained.

FIG. 6B-(a) shows the state in which the conductive paste 12 is collectively filled in the via holes 11 and the via holes 21 and 23 using a squeegee 24 while the adhesive layer 20 and the protective film 22 are adhered to the upper surface of the resin layer 10. In this step, since the squeegee 24 is slid along a rear surface of the protective film 22, the adhesive layer 20 is not damaged.

FIG. 6B-(b) shows the state in which after the conductive paste 12 is filled in the via holes 11, 21, and 23, the protective film 22 is peeled away. In the state described above, the conductive paste 12 partly protrudes above the adhesive layer 20 by a length corresponding to the thickness of the protective film 22.

FIG. 6B-(c) shows a step in which after the laminates formed in the step shown in FIG. 6B-(b) are disposed at a first level and a second level, the core substrate 1 is disposed at the topmost level, and those thus disposed are pressure-bonded to each other while alignment therebetween is performed using pin lamination. The uncured adhesive layers 20 are provided on upper surfaces of the laminates located at the first level and the second level, and the uncured conductive pastes 12 are exposed. Hence, the three described above are pressure-bonded to each other, the adhesive layer 20 is adhered to a lower surface of the core substrate 1, and at the same time, the conductive paste 12 is adhered to the via lands 4. In particular, since the conductive paste 12 partly protrudes from an upper surface of the adhesive layer 20, the adhesion with the via land 4 is improved. When the adhesive layer 20 and the conductive paste 12 are simultaneously cured, the multilayer wiring substrate C shown in FIG. 5 is completed. Since the conductive paste 12 is collectively filled in the via holes 11 and 21, a conductive material can be uniformly dispersed from the via hole 11 to the via hole 21, and hence the resistance is not increased.

In addition, as a method to be used instead of the step (d) of FIG. 6A, in a manner similar to that shown in FIG. 4, the adhesive layer 20 and the protective film 22 in which no via holes are formed may be adhered and then irradiated with laser at positions corresponding to the via holes 11 and the via lands 3 to form the via holes 21 and 23 in the adhesive layer 20 and the protective film 22, respectively.

Example 4

FIG. 7 shows a fourth example of the manufacturing method of a multilayer wiring substrate. Elements corresponding to those in the third example are designated by the same reference numerals, and a duplicated description thereof is omitted. In this example, as shown in FIG. 7-(a), mounting lands 31 and via lands 32, which are wiring patterns, are formed on a carrier 30 made of a metal plate, a resin film, or the like, and the circuit component 7 is mounted on the mounting lands 31. In this case, the wiring patterns 31 and 32 may be formed, for example, in such a way that a metal foil such as a copper foil is adhered onto the carrier 30 and is then patterned by a known method, or the wiring patterns 31 and 32 may be formed by plating on the carrier 30.

Next, as shown in FIG. 7-(b), after the uncured resin layer 10 is overlapped on and pressure-bonded to the carrier 30, curing is performed, so that the circuit component 7 is embedded in the resin layer 10. Subsequently, as shown in FIG. 7-(c), laser light is radiated from above the cured resin layer 10, so that the via holes 11 each having a bottom made of the via land [3] 32 are processed. Next, as shown in FIG. 7-(d), the adhesive layer 20 lined with the protective film 22 is pressure-bonded to the upper surface of the resin layer 10 provided with the via holes 11 formed therein, and the conductive paste 12 is collectively filled in the via hole 11 provided in the resin layer 10 and the via holes 21 and 23 provided in the adhesive layer 20 and the protective film 22. The via holes 21 and 23 may be formed in the adhesive layer 20 and the protective film 22, respectively, either before or after the adhesive layer 20 and the protective film 22 are pressure-bonded to the resin layer 10. Subsequently, as shown in FIG. 7-(e), the protective film 22 is peeled away from the adhesive layer 20, and the carrier 30 is also peeled away from the resin layer 10. In addition, the peeling of the carrier 30 is not necessarily performed at the (e) stage and may be performed any time after the resin layer 10 is cured at the (b) stage. By peeling away the carrier 30, the wiring patterns 31 and 32 are exposed at a lower surface of the resin layer 10.

Subsequently, after the two laminates formed in FIG. 7-(e) are laminated to each other, and the core substrate 1 is disposed on the top of the two laminates, those are collectively heated while being pressurized (see FIG. 7-(f). As a result, the adhesive layers 20 and the conductive pastes 12 are simultaneously cured, so that a multilayer wiring substrate D as shown in FIG. 7-(g) is completed. In the case of this multilayer wiring substrate D, since the core substrate 1 is not provided between the resin layers 10, the multilayer wiring substrate D has a thin structure as compared to that of the multilayer wiring substrate C of the third example.

Example 5

Figure 8A:
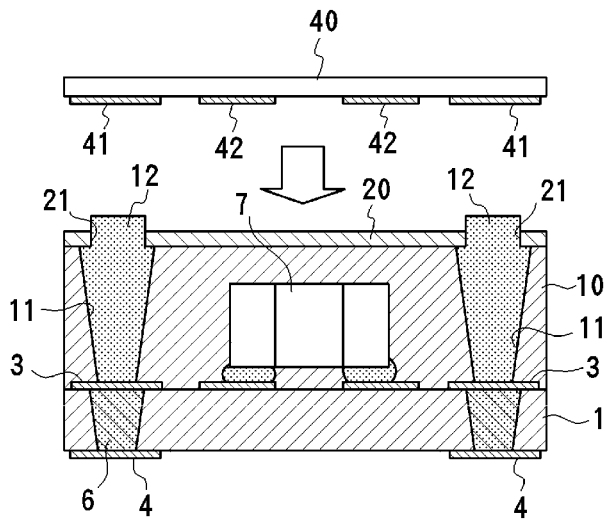
FIGS. 8A to 8C are views showing a manufacturing process according to a fifth example of the multilayer wiring substrate according to a preferred embodiment of the present invention.
Figure 8B:
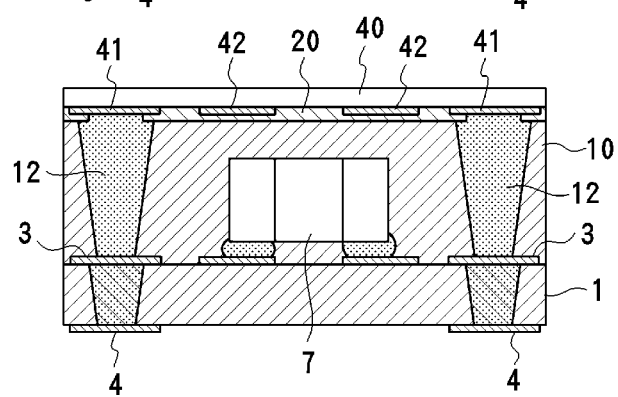
Figure 8C:
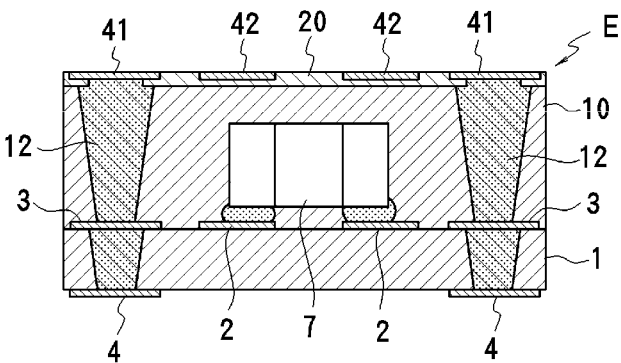

FIG. 8 shows a fifth example of the manufacturing method of a multilayer wiring substrate according to a preferred embodiment of the present invention. Elements corresponding to those in the third example are designated by the same reference numerals, and a duplicate description thereof is omitted. In this example, as shown in FIG. 8-(a), a laminate (see FIG. 6B-(b)) in the state in which the resin layer 10 is formed on the core substrate 1, the adhesive layer 20 is formed on the resin layer 10, and the via holes 11 and 21 are filled with the conductive paste 12 is prepared, and a carrier 40 provided with a wiring pattern 41 corresponding to the via holes 11 and 21 and a mounting wiring pattern 42 formed on the surface thereof is also prepared. The conductive paste 12 protrudes by a length corresponding to the thickness of a protective film which supports a rear surface of the adhesive layer 20. In addition, the surfaces of the wiring patterns 41 and 42 may be roughened. As the carrier 40, although a resin film or a metal thin plate may be used, a material having flexibility is preferable.

Next, as shown in FIG. 8-(b), the carrier 40 is pressure-bonded to the adhesive layer 20. In this step, since the wiring patterns 41 and 42 slightly protrude from the carrier 40, and the conductive paste 12 also protrudes from the adhesive layer 20, the wiring pattern 41 and the conductive paste 12 are strongly pressure-bonded to each other. In addition, the wiring patterns 41 and 42 are also pressure-bonded to the adhesive layer 20 without forming any gaps therebetween. While this pressure application state is maintained, the adhesive layer 20 and the conductive paste 12 are heat-cured. Subsequently, the carrier 40 is peeled away, so that a multilayer wiring substrate E shown in FIG. 8-(c) can be obtained. In the peeling, when the surfaces of the wiring patterns 41 and 42 are roughened, a pattern shift can be prevented when the carrier 40 is pressure-bonded to the adhesive layer 20, and since the bonding force to the cured adhesive layer 20 is high, when the carrier 40 is peeled away, the wiring patterns 41 and 42 are not likely to be peeled away together therewith.

Example 6

FIG. 9 shows a sixth example of the manufacturing method of a multilayer wiring substrate. This example is a modification of the fifth example, and a convex portion 43 insertable into the via holes 11 and 21 is formed on the wiring pattern 41. As a method for manufacturing the convex portion 43, for example, a method may be used in which after a copper foil is adhered to the surface of the carrier 40, and a plating resist is formed on the surface of this copper foil, an opening portion is formed in the plating resist by a photolithographic technique, and a metal plating film is formed on the opening portion by electrolytic plating to form the convex portion 43. Alternatively, the convex portion 43 may be formed, for example, in such a way that after a copper foil is adhered to the surface of the carrier 40, and an etching resist is formed on the surface of the copper foil, portions of the copper foil on which the etching resist is not formed are removed by an etching solution to form the convex portion 43. The height of the convex portion 43 is preferably approximately 10 μm to 50 μm, for example. The height of the convex portion 43 is more preferably larger than the thickness of the adhesive layer 20.

In this case, as shown in FIG. 9-(b), since the convex portion 43 is inserted into the via holes 11 and 21, and the via holes 11 function as a guide, a self-alignment function can be imparted to every wiring pattern unit by an anchor effect, so that wiring formation having a higher transfer accuracy can be achieved. By the self-alignment function thus imparted, when the wiring pattern has accuracy to a certain extent, the position thereof is corrected to a desired position. Hence, a material having a low rigidity which is liable to cause displacement may be used for the carrier 40. Accordingly, when pressure bonding is performed to a thin resin layer or the like, follow-up characteristics to a base member are improved, and hence uniform pressure bonding can be performed. Besides the prevention of lateral shift of the carrier 40 and the resin layer 10 by an anchor effect, since the convex portion 43 is inserted into the conductive paste 12, the contact area therebetween is increased, and the density of the paste 12 is also increased due to an increase in inner pressure thereof, so that the resistance can be decreased. After the adhesive layer 20 and the conductive paste 12 are cured, the carrier 40 is peeled away, so that a multilayer wiring substrate F is obtained. In this step, since the convex portion 43 is buried in the conductive paste 12, the bonding force between the wiring pattern 41 and the conductive paste 12 is increased, and hence the wiring pattern 41 is prevented from being peeled away together with the carrier 40.

Example 7

Figure 10A:
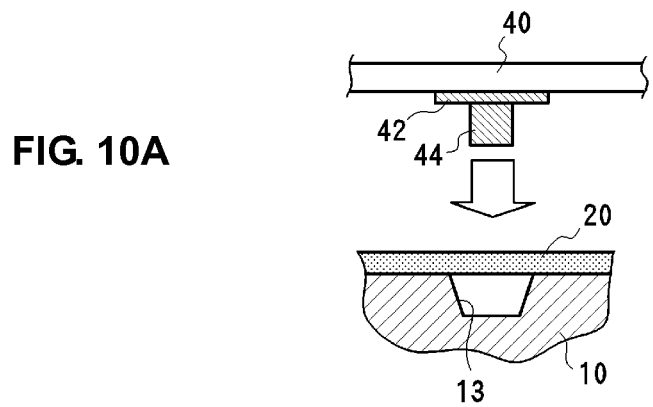
FIGS. 10A and 10B are views partly showing a manufacturing process according to a seventh example of the multilayer wiring substrate according to a preferred embodiment of the present invention.
Figure 10B:
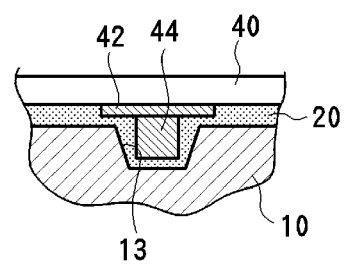
Figure 11A:
FIGS. 11A(a) to 11A(e) are views showing a first half of a manufacturing process for a conventional multilayer wiring substrate.
Figure 11A:
Figure 11A:
Figure 11A:
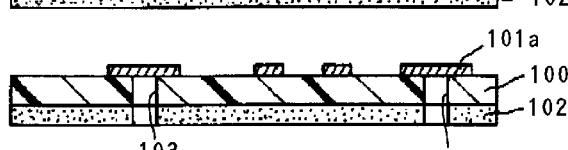
Figure 11A:
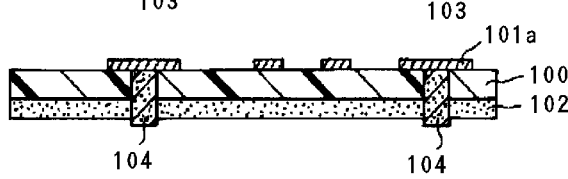
Figure 11B:
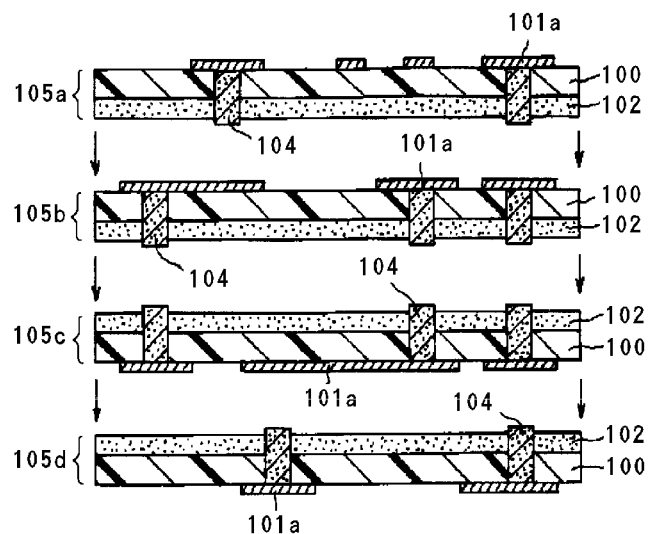
FIG. 11B is a view showing a second half of the manufacturing process for the conventional multilayer wiring substrate.
Figure 12:
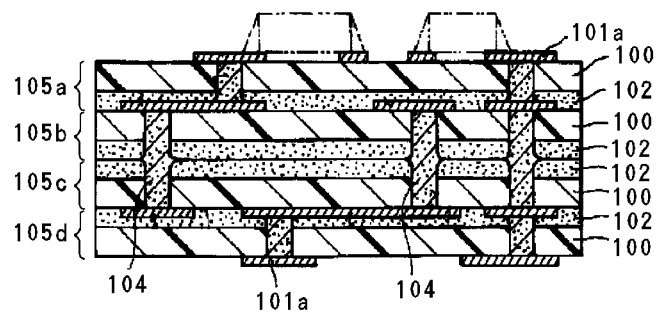
FIG. 12 is a cross-sectional view showing the structure of the conventional multilayer wiring substrate.

FIG. 10 shows a seventh example of the manufacturing method of a multilayer wiring substrate according to a preferred embodiment of the present invention. This is a partly modified example of the sixth example. First, as shown in FIG. 10-(*a*), a concave portion 13 is formed in an upper surface of the cured resin layer 10, and the adhesive layer 20 is disposed thereon. In the state in which the adhesive layer 20 is disposed as described above, the concave portion 13 may be a cavity or may be filled with the adhesive layer 20. A convex portion 44 engageable with the concave portion 13 is formed on the wiring pattern 42 provided on the carrier 40. The total thickness of the wiring pattern 42 and the convex portion 44 is preferably set larger than the thickness of the adhesive layer 20 and is preferably set smaller than the depth of the concave portion 13. This convex portion 44 can also be formed in a manner similar to that for the convex portion 43 of the sixth example.

FIG. 10-(*b*) shows the state in which the carrier 40 is pressure-bonded to the adhesive layer 20. When the carrier 40 is pressure-bonded to the adhesive layer 20, since the convex portion 44 is guided by the concave portion 13 and is then engaged therewith, by its self-alignment function, the wiring pattern 42 is prevented from being shifted. In addition, since a portion of the adhesive layer 20 is pressed by the convex portion 44 and is filled in the concave portion 13, the concave portion 13 is filled with the adhesive layer 20 without forming any gaps therebetween.

The present invention is not limited to the examples of preferred embodiments described above. For example, in combination of the manufacturing methods according to the first to the seventh examples of preferred embodiments of the present invention, a multilayer wiring substrate having a different structure may also be formed. In addition, in the example of a preferred embodiment of the preset invention shown in FIG. 9, although the convex portion is formed on the exposed surface of the wiring pattern adhered to the carrier, for example, when laminates are stacked to each other as shown in FIG. 6B-(c), a convex portion may be formed on a via land provided on a lower surface of a substrate facing a conductive paste so that the convex portion is buried in the conductive paste.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer wiring substrate comprising:
   a first step of preparing a first resin layer in a cured state including a conductive pattern and in which a first via hole including a bottom made of the conductive pattern is formed;
   a second step of preparing a second resin layer in an uncured state in which a second via hole is formed at a position corresponding to the first via hole to penetrate the second resin layer;
   a third step of laminating the first resin layer and the second resin layer so that the first via hole and the second via hole communicate with each other;
   a fourth step of simultaneously filling a conductive paste in the first via hole and the second via hole;
   a fifth step of performing pressure bonding of a metal foil to the second resin layer in which the second via hole is filled with the conductive paste so that the metal foil is brought into contact with the conductive paste;
   a sixth step of curing the second resin layer and the conductive paste after the fifth step; and
   a seventh step of patterning the metal foil to form a wiring pattern electrically connected to the conductive paste which is cured in the second via hole.

2. A method for manufacturing a multilayer wiring substrate comprising:
   a first step of preparing a first resin layer in a cured state including a conductive pattern and in which a first via hole including a bottom made of the conductive pattern is formed;
   a second step of preparing a second resin layer in an uncured state in which a second via hole is formed at a position corresponding to the first via hole to penetrate the second resin layer;
   a third step of laminating the first resin layer and the second resin layer so that the first via hole and the second via hole communicate with each other;
   a fourth step of simultaneously filling a conductive paste in the first via hole and the second via hole;
   a fifth step of performing pressure bonding of a substrate provided with a wiring pattern on a surface thereof to the second resin layer so that the conductive paste filled in the second via hole and the wiring pattern are brought into contact with each other; and
   a sixth step of curing the second resin layer and the conductive paste after the fifth step.

3. The method for manufacturing a multilayer wiring substrate according to claim 2, wherein in the fifth step, the substrate is a carrier, and the carrier is pressure-bonded to the second resin layer, and after the sixth step of curing the second resin layer and the conductive paste, the carrier is peeled away.

4. The method for manufacturing a multilayer wiring substrate according to claim 2, wherein in the fifth step, a convex portion is formed on an exposed surface of the wiring pattern, and when the substrate is pressure-bonded to the second resin layer, the convex portion is inserted into the second via hole.

5. The method for manufacturing a multilayer wiring substrate according to claim 1, wherein in the first step, after an uncured resin layer is pressure-bonded to a surface of a base member provided with a conductive pattern formed thereon, the uncured resin layer is cured to form the first resin layer, and the first resin layer is laser-processed, so that the first via hole having a bottom made of the conductive pattern is formed.

6. The method for manufacturing a multilayer wiring substrate according to claim 5, wherein in the first step, after a circuit component is mounted on the conductive pattern, and the circuit component is embedded in a resin layer in an uncured state, the resin layer is cured, so that the first resin layer incorporating the circuit component is obtained.

7. The method for manufacturing a multilayer wiring substrate according to claim 1, wherein a diameter of the second via hole is smaller than an opening diameter of the first via hole.

* * * * *